United States Patent

Oohira

(10) Patent No.: US 8,106,647 B2
(45) Date of Patent: Jan. 31, 2012

(54) ROTATION SENSOR

(75) Inventor: Satoshi Oohira, Gifu (JP)

(73) Assignee: DENSO CORPORATION, Kariya (JP)

( * ) Notice: Subject to any disclaimer, the term of this patent is extended or adjusted under 35 U.S.C. 154(b) by 201 days.

(21) Appl. No.: 12/461,275

(22) Filed: Aug. 6, 2009

(65) Prior Publication Data

US 2009/0295375 A1    Dec. 3, 2009

(51) Int. Cl.
*G01P 3/48*    (2006.01)
(52) U.S. Cl. .............. 324/166; 324/207.21; 324/202
(58) Field of Classification Search .............. None
See application file for complete search history.

(56) References Cited

U.S. PATENT DOCUMENTS

| | | | |
|---|---|---|---|
| 5,497,082 A * | 3/1996 | Hancock | 324/207.14 |
| 6,064,197 A | 5/2000 | Lochmann et al. | |
| 6,212,783 B1 | 4/2001 | Ott et al. | |
| 6,366,079 B1 | 4/2002 | Uenoyama | |
| 6,448,768 B1 * | 9/2002 | Ishibashi et al. | 324/251 |

FOREIGN PATENT DOCUMENTS

| | | |
|---|---|---|
| JP | A-H1-251763 | 10/1989 |
| JP | A-H10-332725 | 12/1998 |
| JP | A-2001-159542 | 6/2001 |
| JP | A-2006-128400 | 5/2006 |
| JP | A-2006-275764 | 10/2006 |
| WO | WO 2005/111546 | 11/2005 |

OTHER PUBLICATIONS

T.IEE Japan, vol. 190-C, No. 7, pp. 483-490, 1989 (partial English translation enclosed).
Office Action mailed Sep. 20, 2011 in corresponding JP application No. 2007-17986 (and English translation).

* cited by examiner

*Primary Examiner* — Jermele M Hollington
*Assistant Examiner* — Trung Nguyen
(74) *Attorney, Agent, or Firm* — Posz Law Group, PLC

(57) ABSTRACT

A rotation sensor for detecting rotation of an object includes a semiconductor substrate, a vertical Hall element, and a magnetoresistive element. The vertical Hall element is formed in the semiconductor substrate to detect a magnetic field parallel to a surface of the semiconductor substrate. The vertical Hall element outputs a detection signal corresponding to the detected magnetic field. The magnetoresistive element is formed on the surface of the semiconductor substrate and has a resistance value changing with strength of the magnetic field. The magnetoresistive element outputs a resistance signal corresponding to the resistance value. The rotation is detected based on the detection signal and the resistance signal.

9 Claims, 12 Drawing Sheets

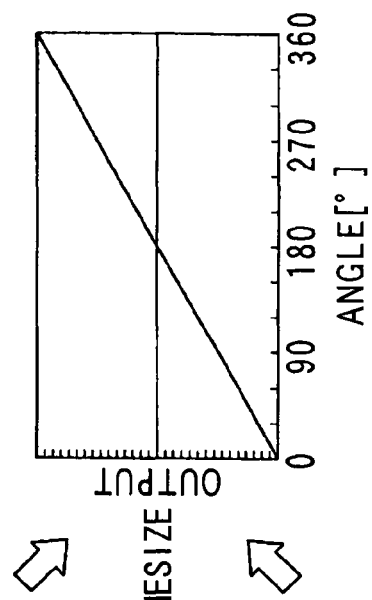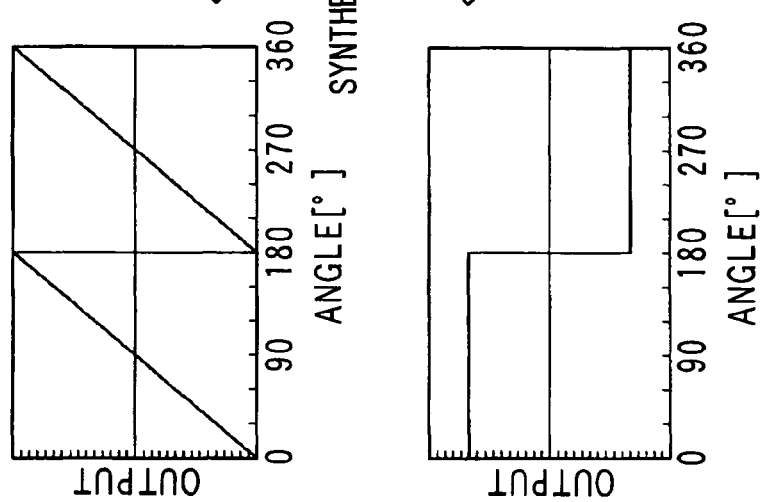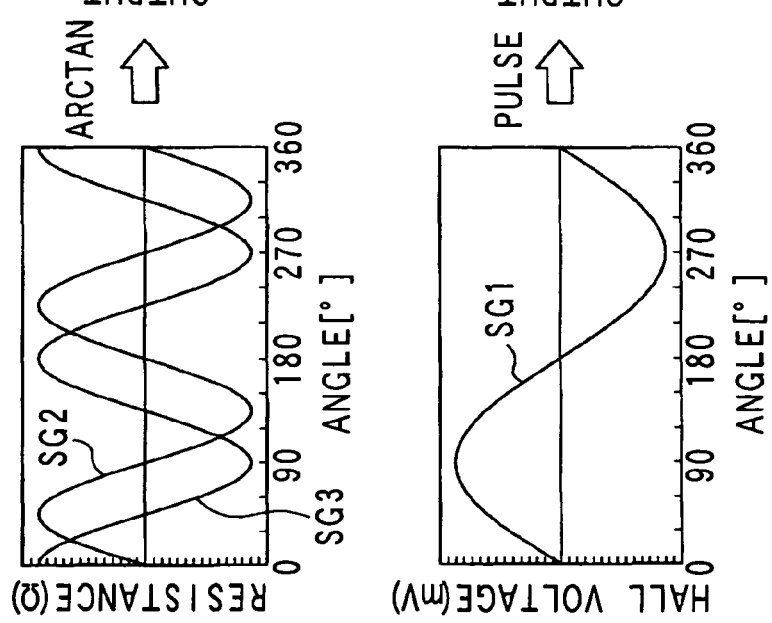

ROTATION SENSOR

CROSS REFERENCE TO RELATED APPLICATION

This application is based on and incorporates herein by reference Japanese Patent Application No. 2007-17986 filed on Jan. 29, 2007.

FIELD OF THE INVENTION

The present invention relates to a rotation sensor for detecting rotation of an object.

BACKGROUND OF THE INVENTION

A rotation sensor using multiple magnetoresistive elements (MREs) has been disclosed in, for example, JP-A-2001-153683 and JP-A-H10-332725. In a rotation sensor disclosed in JP-A-2001-153683, two MRE bridges are symmetrically arranged with respect to a magnetic center of a bias magnetic field. On the other hand, in a rotation sensor disclosed in JP-A-H10-332725, two MREs are arranged adjacent to a gear so that signals outputted from the MREs can have a phase difference, and a rotation direction of the gear is detected based on rising edges of the signals.

In recent years, there has been an increase in demand for small and high accuracy sensors. In particular, as the X-by-wire technologies move forward, a rotation sensor is required to meet exacting requirements such as a small size, a detection range of 360°, and an accuracy of 0.1% FS.

SUMMARY OF THE INVENTION

In view of the above, it is an object of the present invention to provide a small rotation sensor.

According to an aspect of the present invention, a rotation sensor for detecting rotation of an object includes a semiconductor substrate, a vertical Hall element, and a magnetoresistive element. The vertical Hall element is formed in the semiconductor substrate to detect a magnetic field parallel to a surface of the semiconductor substrate. The vertical Hall element outputs a detection signal corresponding to the detected magnetic field. The magnetoresistive element is formed on the semiconductor substrate and has a resistance value changing with strength of the magnetic field. The magnetoresistive element outputs a resistance signal corresponding to the resistance value. The rotation is detected based on the detection signal and the resistance signal.

BRIEF DESCRIPTION OF THE DRAWINGS

The above and other objectives, features and advantages of the present invention will become more apparent from the following detailed description made with check to the accompanying drawings. In the drawings:

FIGS. 6A-6E are diagrams illustrating waveforms of signals of the rotation sensor;

DETAILED DESCRIPTION OF THE PREFERRED EMBODIMENTS

First Embodiment

Figure 1A:
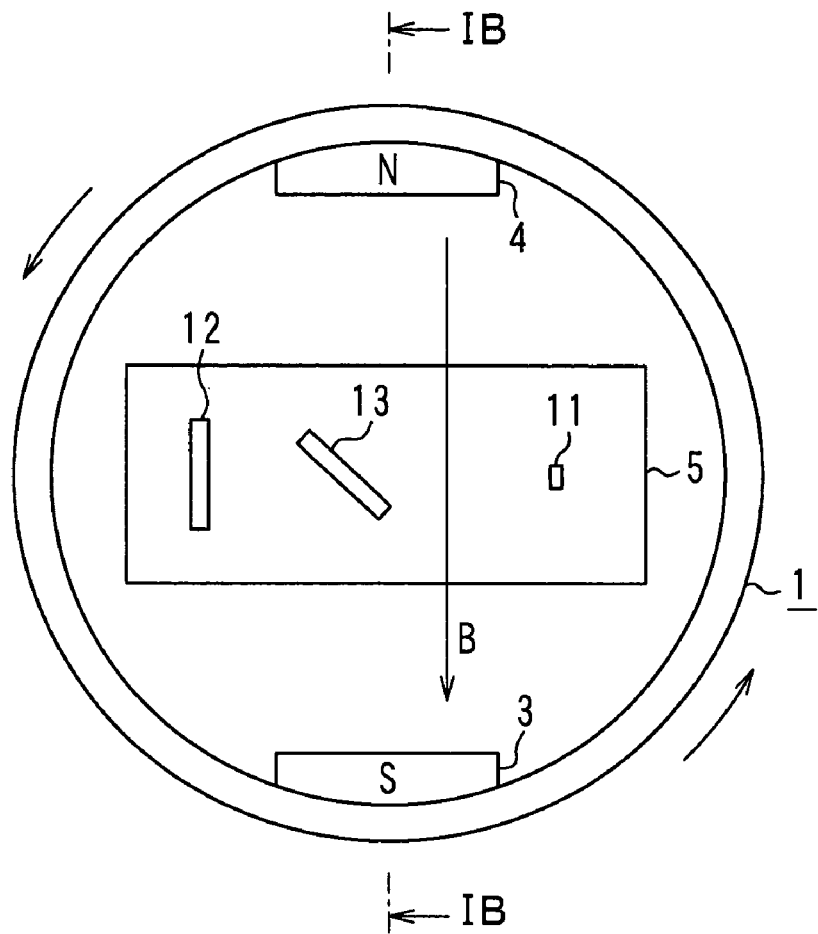
FIG. 1A is a diagram illustrating a plan view of a rotation sensor according to a first embodiment of the present invention.

A rotation sensor according to a first embodiment of the present invention is described below with reference to FIGS. 1A and 1B. FIG. 1A is a diagram illustrating a plan view of the rotation sensor, and FIG. 1B is a diagram illustrating a cross-sectional view taken along the line IB-IB in FIG. 1A.

Figure 1B:
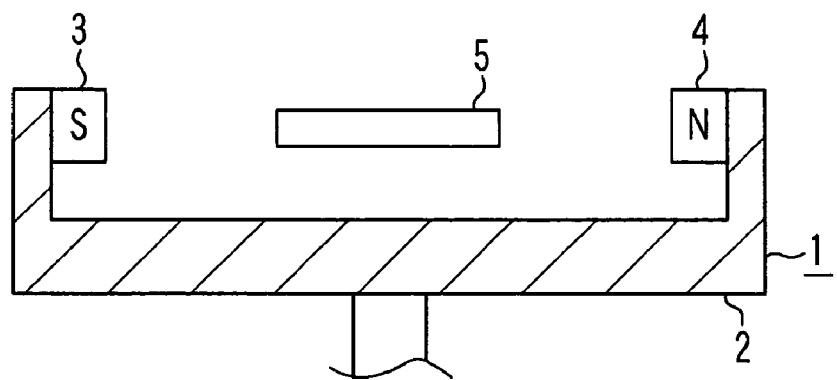
FIG. 1B is a diagram illustrating a cross-sectional view taken along the line IB-IB in FIG. 1A.

As shown in FIGS. 1A and 1B, the rotation sensor is configured to detect rotation of a magnetic rotor 1 as an object. The magnetic rotor 1 includes a rotor body 2 shaped like a hollow cylinder with a bottom. A south pole permanent magnet 3 and a north pole permanent magnet 4 are located on an inner surface of the rotor body 2 to face each other. A sensor chip 5 is located inside the rotor body 2. The sensor chip 5 is located between the permanent magnets 3 and 4 and spaced from each of the permanent magnets 3 and 4. A magnetic field generated by the permanent magnets 3 and 4 is applied to the sensor chip 5.

Figure 2:
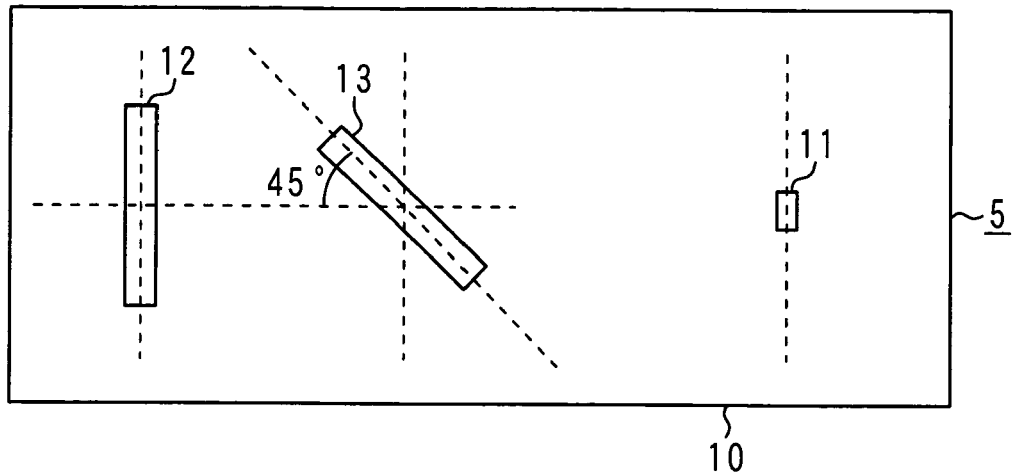
FIG. 2 is a diagram illustrating a plan view of a sensor chip of the rotation sensor of the first embodiment.

The sensor chip 5 is illustrated in detail in FIG. 2. As shown in FIG. 2, a vertical Hall element 11 is formed in a semiconductor substrate 10, and magnetoresistive elements (MREs) 12 and 13 are formed on a surface of the semiconductor substrate 10. For example, the magnetoresistive elements 12, 13 can be made of thin films of NiFe. In this way, one vertical Hall element 11 and two magnetoresistive elements 12, 13 are arranged in the common semiconductor substrate 10, i.e., in the common sensor chip 5.

A magnetic sensitive surface of the vertical Hall element 11 is arranged in parallel to the longitudinal direction of the magnetoresistive element 12 so that the vertical Hall element 11 can detect a magnetic field parallel to the surface of the semiconductor substrate 10. Resistance values of the magnetoresistive elements 12, 13 change with strength of the magnetic field parallel to the surface of the semiconductor substrate 10. That is, the resistance values of the magnetoresistive elements 12, 13 change with the rotation of the magnetic rotor 1. The magnetoresistive elements 12, 13 output resistance signals corresponding to their resistance values, respectively. For example, each of the magnetoresistive elements 12 and 13 can have a strip shape. The longitudinal direction of the magnetoresistive element 13 is angled at 45° relative to the longitudinal direction of the magnetoresistive element 12. Accordingly, the resistance signals outputted from the magnetoresistive elements 12 and 13 during the rotation of the magnetic rotor 1 have a phase difference of 45°.

As shown in FIG. 2, the magnetoresistive elements 12 and 13 are located adjacent to each other. It is preferable that the magnetoresistive elements 12 and 13 be located as close to each other as possible in the sensor chip 5. It is noted that peripheral circuits such as a calculation circuit and a correction circuit can be integrated into the sensor chip 5.

Figure 3:
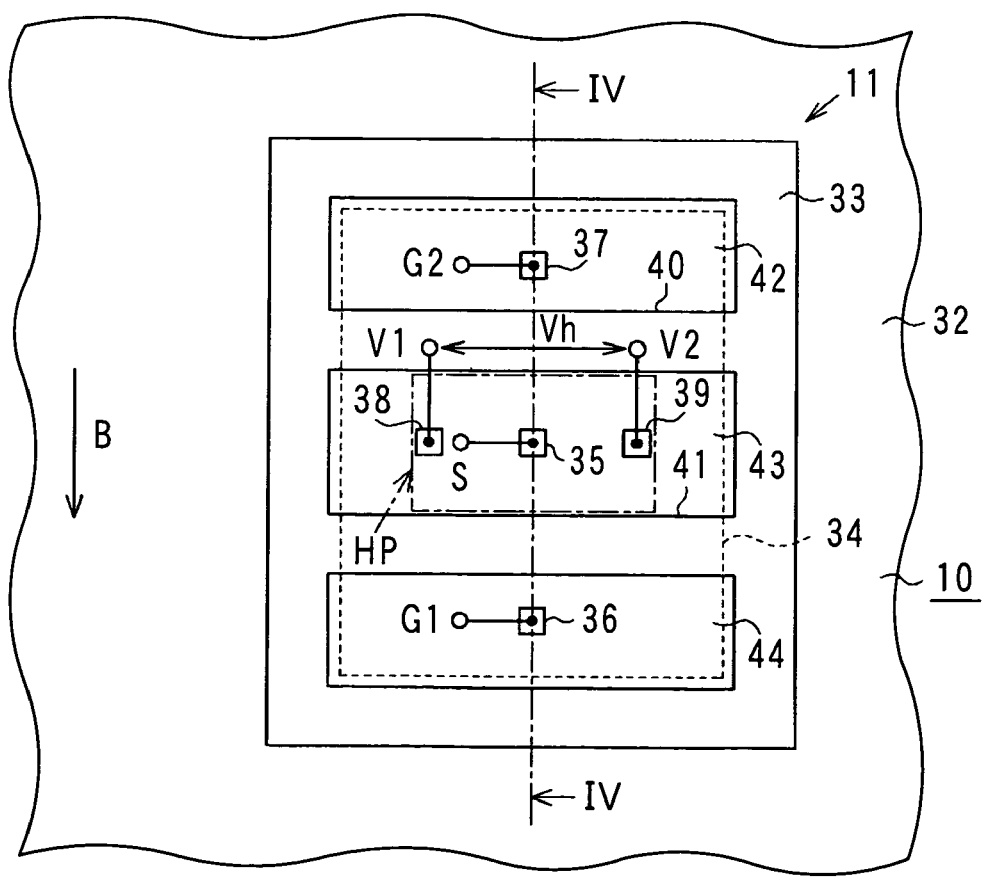
FIG. 3 is a diagram illustrating a plan view of a vertical Hall element of the sensor chip.
Figure 4:
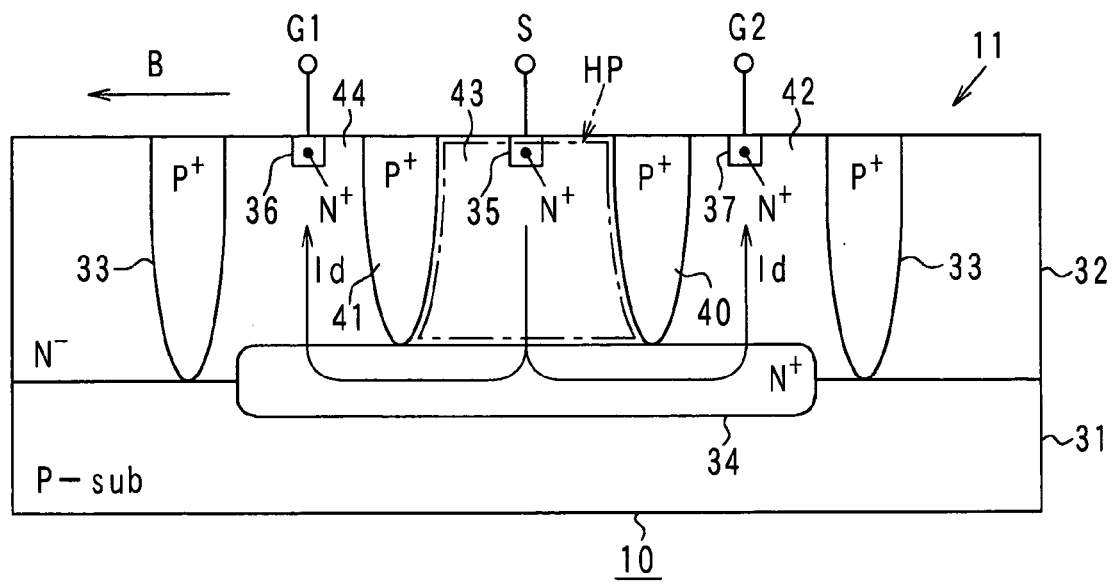
FIG. 4 is a diagram illustrating a cross-sectional view taken along the line IV-IV in FIG. 3.

The vertical Hall element 11 is illustrated in detail in FIGS. 3 and 4. FIG. 3 illustrates a plan view of the vertical Hall element 11, and FIG. 4 illustrates a cross-sectional view taken along the line IV-IV in FIG. 3.

As shown in FIG. 4, an N-type silicon layer 32 is formed on a P-type silicon substrate 31 by an epitaxial growth method. The P-type silicon substrate 31 and the N-type silicon layer 32 form a semiconductor substrate. A P-type impurity diffusion layer 33 is formed in the N-type silicon layer 32 for element separation. As shown in FIG. 3, the P-type impurity diffusion layer 33 has a planar structure shaped like a rectangular ring. As shown in FIG. 4, the P-type impurity diffusion layer 33 has a cross-sectional structure extending to reach the P-type silicon substrate 31. A region of the N-type silicon layer 32 surrounded by the P-type impurity diffusion layer 33 is a Hall element region where the vertical Hall element 11 is formed. An N-type buried layer 34 is formed in the Hall element region.

$N^+$-type contact regions 35, 36, 37, 38 and 39 are formed to a surface portion of the N-type silicon layer 32 in the Hall element region. The $N^+$-type contact regions 35, 36, 37, 38 and 39 are electrically connected through wires (not shown) to terminals S, G1, G2, V1, and V2, respectively. Each of the contact regions 36, 37 is paired with the contact region 35 to form a current input portion. The contact regions 38, 39 are paired with each other to form a voltage output portion.

As shown in FIG. 3, P-type impurity diffusion regions 40, 41 are formed in the N-type silicon layer 32. The P-type impurity diffusion regions 40, 41 have planer structure dividing the Hall element region into three sections 42, 43, and 44. As shown in FIG. 4, the P-type impurity diffusion regions 40, 41 has a cross-sectional structure extending to reach the N-type buried layer 34. The contact regions 35, 38, and 39 in the section 43 are arranged in a first line. Further, the contact region 37 in the region 42, the contact region 35 in the section 43, and the contact region 36 in the section 44 are arranged in a second line. The first and second lines are perpendicular to each other.

A region of the section 43 sandwiched between the contact regions 38 and 39 is a Hall plate (HP) acting as a magnetic detecting portion. The vertical Hall element 11 outputs a Hall voltage signal corresponding to a magnetic field applied to the HP.

The vertical Hall element 11 is supplied with a constant driving current Id flowing from the terminal S to each of the terminals G1 and G2. Specifically, as shown in FIG. 4, the driving current Id flows from the contact region 35 and passes through the magnetic detecting portion HP in a downward direction. Then, the driving current Id flows to portions under the contact regions 36, 37 by passing through the N-type buried layer 34 in a lateral direction. Then, the driving current Id flows in an upward direction and reaches the contact regions 36 and 37. In this way, the driving current Id flowing through the magnetic detecting portion HP has a current component perpendicular to the surface of the semiconductor substrate 10 (i.e., the sensor chip 5). Therefore, when a magnetic field (e.g., indicated by an arrow B in FIGS. 3 and 4) having a magnetic field component parallel to the surface of the semiconductor substrate 10 is applied to the magnetic detecting portion HP, a Hall voltage Vh corresponding to the applied magnetic field component is generated between the terminals V1 and V2. Thus, the magnetic field component parallel to the surface of the semiconductor substrate 10 can be detected based on the Hall voltage Vh across the terminals V1 and V2.

Figure 5:
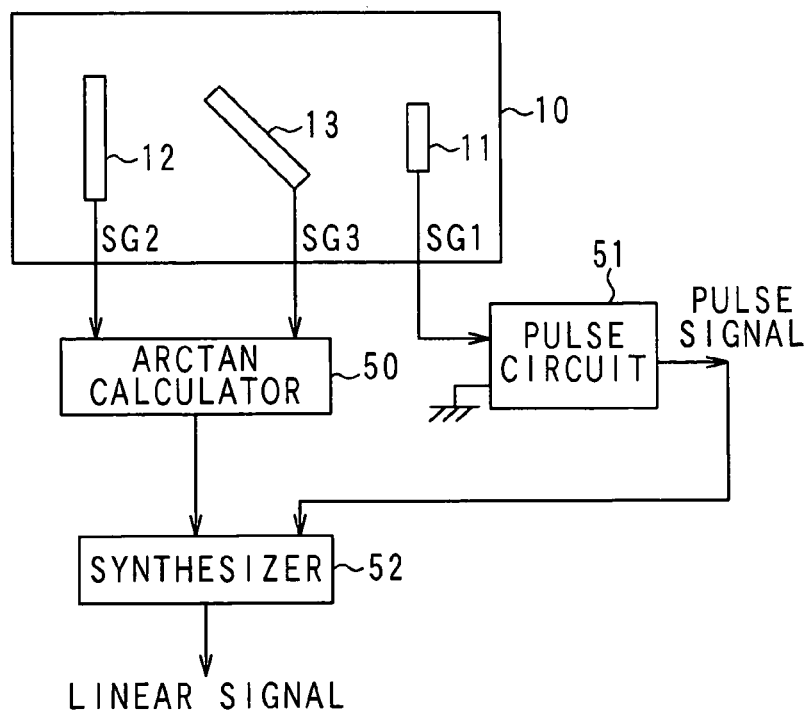
FIG. 5 is a diagram illustrating an electrical configuration of the rotation sensor.

An electrical configuration of the rotation sensor is described below with reference to FIG. 5. As shown in FIG. 5, the rotation sensor includes an arctan calculator 50, a pulse circuit 51, and a synthesizer 52 as peripheral circuits for the vertical Hall element 11 and the magnetoresistive elements 12 and 13. The arctan calculator 50 calculates the arctangent of signals SG2 and SG3 outputted from the magnetoresistive elements 12 and 13, respectively. The signals SG2 and SG3 have signal levels corresponding to the resistance values of the magnetoresistive elements 12 and 13, respectively. The vertical Hall element 11 is connected to the pulse circuit 51 so that a signal SG1 outputted from the vertical Hall element 11 can be pulsed (i.e., converted to a pulse signal) by the pulse circuit 51. Each of the arctan calculator 50 and the pulse circuit 51 is connected to the synthesizer 52. The synthesizer 52 synthesizes output signals of the arctan calculator 50 and the pulse circuit 51, thereby outputting a linear signal representing the rotation of the magnetic rotor 1 over a range of angles from 0° to 360°.

An operation of the rotation sensor is described below with reference to FIGS. 6A-6E. FIGS. 6A-6E are waveform diagrams illustrating processes for generating the linear signal from the signals SG1-SG3.

The resistance values of the magnetoresistive elements 12 and 13 change with the rotation of the magnetic rotor 1. That is, the resistance values of the magnetoresistive elements 12 and 13 change with a change in a rotation angel of the magnetic rotor 1. The signals SG2 and SG3 outputted from the magnetoresistive elements 12 and 13 have phase differences of 45° with respect to each other and thus change like sine and cosine curves.

The magnetoresistive elements 12 and 13 cannot distinguish between the south pole permanent magnet 3 and the north pole permanent magnet 4, because the resistance values of the magnetoresistive elements 12 and 13 change depending on the strength of the magnetic field. Therefore, as shown in FIG. 6A, two periods of the signals SG1 and SG2 are outputted from the magnetoresistive elements 12 and 13 during a 360° rotation of the permanent magnets 3 and 4 along with a 360° rotation of the magnetic rotor 1.

On the other hand, the vertical Hall element 11 can distinguish between the south pole permanent magnet 3 and the north pole permanent magnet 4. Therefore, as shown in FIG. 6C, one period of the signal SG1 is outputted from the vertical Hall element 11 during a 360° rotation of the permanent magnets 3 and 4 along with a 360° rotation of the magnetic rotor 1.

The arctan calculator 50 calculates the arctangent of the signals SG2 and SG3 outputted from the magnetoresistive elements 12 and 13 so as to combine the signals SG2 and SG3 together. Thus, as shown in FIG. 6B, the arctan calculator 50 outputs a 180°-linear signal that linearly changes with a period of 180°.

Further, the signal SG1 outputted from the vertical Hall element 11 is pulsed by the pulse circuit 51. Thus, as shown in FIG. 6D, the pulse circuit 51 outputs a pulse signal that changes between a high level and a low level with a period of 180°.

The 180°-linear signal outputted from the arctan calculator 50 and the pulse signal outputted from the pulse circuit 51 are synthesized by the synthesizer 52. Thus, as shown in FIG. 6E, the synthesizer 52 outputs a 360°-linear signal representing the rotation of the magnetic rotor 1 over the range of angles from 0° to 360°. In this way, the signals SG2, SG3 are distinguished between when the signal SG1 has a plus level and when the signal SG1 has a minus level, and the distinguished signals are synthesized to obtain the 360°-linear signal representing the rotation of the magnetic rotor 1 over the range of angles from 0° to 360°.

The magnetic field sensitivity of each of the magnetoresistive elements 12 and 13 is higher than that of the vertical Hall element 11. Therefore, the accuracy of the rotation sensor can be improved by using the signals SG2 and SG3 outputted from the magnetoresistive elements 12 and 13 to obtain the linear signal. Further, the rotation sensor can be achieved, even if the strengths of the permanent magnets 3, 4 are small. Therefore, cost of the permanent magnets 3, 4 can be reduced so that cost of the rotation sensor can be reduced accordingly. While size of each of the magnetoresistive elements 12 and 13 is about 1 mm, size (length and width) of the vertical Hall element 11 is about 100 μm. That is, the size of the vertical Hall element 11 is one-tenth of the size of each of the magnetoresistive elements 12 and 13. Since the pulse signal is obtained by using the vertical Hall element 11, the rotation sensor can have a small size. In this way, the rotation sensor can have a high accuracy and a small size.

Advantages of the rotation sensor according to the first embodiment are discussed below.

Figure 7:
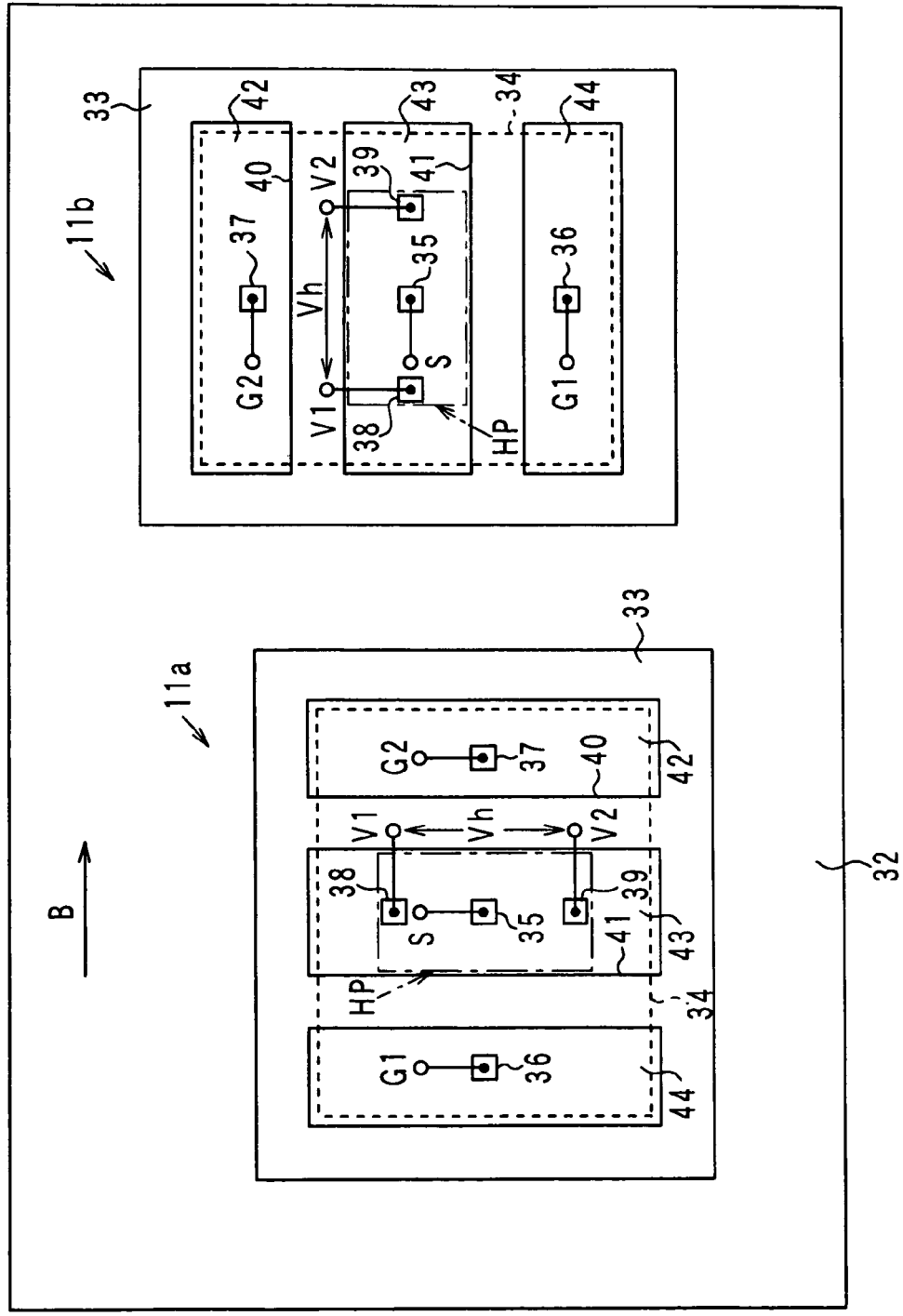
FIG. 7 is a diagram illustrating a plan view of a sensor chip according to a first comparison example.

FIG. 7 is a diagram illustrating a sensor chip as an example compared to the sensor chip 5 of the first embodiment. In the comparison example, two vertical Hall elements 11a and 11b are formed in a common semiconductor substrate in such a manner that output signals of the vertical Hall elements 11a and 11b can have a phase difference of 90°. A 360®-linear signal representing rotation of the magnetic rotor 1 over a range of angles from 0° to 360° can be obtained by calculating the arctangent of the output signals of the vertical Hall elements 11a and 11b. In such an approach, a rotation sensor capable of outputting the 360°-linear signal can be implemented on a single chip by using two vertical Hall elements 11a and 11b. However, as mentioned previously, a magnetic field sensitivity of a magnetoresistive element is higher than that of a Hall element. Therefore, according to the comparison example shown in FIG. 7, since sensitivity of the vertical Hall elements 11a and 11b are small, a detection signal becomes small accordingly. As a result, it is likely that sensor accuracy may be degraded due to noise. In contrast, according to the first embodiment, the magnetoresistive elements 12 and 13 having high sensitivities are used so that a detection signal can become large. Accordingly, it is less likely that sensor accuracy is degraded due to noise.

Although the detection signal can be increased by using a high strength magnet, such a high strength magnet is costly. In contrast, according to the first embodiment, since the detection signal is increased by using the magnetoresistive elements 12 and 13, there is no need to use such a costly magnet.

A Hall element typically used for a rotation sensor is a lateral Hall element, which has a magnetic sensitive surface perpendicular to a chip surface to detect a magnetic field perpendicular to the chip surface. That is, a direction of a magnetic field detected by a lateral Hall element is displaced by 90° with respect to a direction of a magnetic field detected by a magnetoresistive element. Therefore, even when a lateral Hall element and a magnetoresistive element are arranged on a common sensor chip, a desired output cannot be obtained. In contrast, according to the first embodiment, the vertical Hall element 11 is used so that the direction of the magnetic field detected by the vertical Hall element 11 can be matched with the direction of the magnetic field detected by the magnetoresistive elements 12 and 13.

As described above, according to the first embodiment, the rotation sensor for detecting rotation of the magnetic rotor 1 includes the semiconductor substrate 10, the vertical Hall element 11, and the magnetoresistive elements 12 and 13. The vertical Hall element 11 is formed in the semiconductor substrate 10 to detect the magnetic field parallel to the surface of the semiconductor substrate 10. The magnetoresistive elements 12 and 13 are formed on the surface of the semiconductor substrate 10. The resistance values of the magnetoresistive elements 12 and 13 change with the strength of the magnetic field parallel to the surface of the semiconductor substrate 10. The vertical Hall element 11 and the magnetoresistive elements 12 and 13 detect the magnetic field in one direction at the same time so that the rotation (i.e., rotation angle) of the magnetic rotor 1 can be detected based on the output signals SG1-SG3 of the vertical Hall element 11 and the magnetoresistive elements 12 and 13. The rotation sensor is reduced in size by using the vertical Hall element 11 that is smaller in size than the magnetoresistive elements 12 and 13.

As mentioned previously, since a magnetoresistive element can detect strength of a magnetic field but cannot distinguish between south and north poles of the magnetic field, the magnetoresistive element outputs a signal with a period of 180° during rotation of an objected to be detected. Therefore, when outputs of magnetoresistive elements that are arranged such that the outputs can have a phase difference of 45° are converted to a linear signal by calculating the arctangent of the outputs, the linear signal represents the rotation of the object only in a range of angles from 0° to 180°. In contrast, according to the first embodiment, the rotation sensor includes the arctan calculator 50, the pulse circuit 51, and the synthesizer 52. The arctan calculator 50 calculates the arctangent of the output signals SG2 and SG3 of the magnetoresistive elements 12 and 13. The pulse circuit 51 pluses the output signal SG1 of the vertical Hall element 11. The synthesizer 52 synthesizes the outputs signals of the arctan calculator 50 and the pulse circuit 51, thereby outputting a 360°-linear signal representing the rotation of the magnetic rotor 1 over a range of angles from 0° to 360°. In this way, the rotation of the magnetic rotor 1 can be detected over a range of angles from 0° to 360 by a simple structure.

For example, the magnetoresistive elements 12 and 13 can be made of thin films of NiFe. In such an approach, the magnetoresistive elements 12 and 13 can detect even a subtle magnetic field.

The sensor chip 5 (i.e., the semiconductor substrate 10) can be made of a semiconductor material other than silicon. For example, the sensor chip 5 can be made of a compound semiconductor material such as GaAs, InAs, or InSb.

Figure 8:
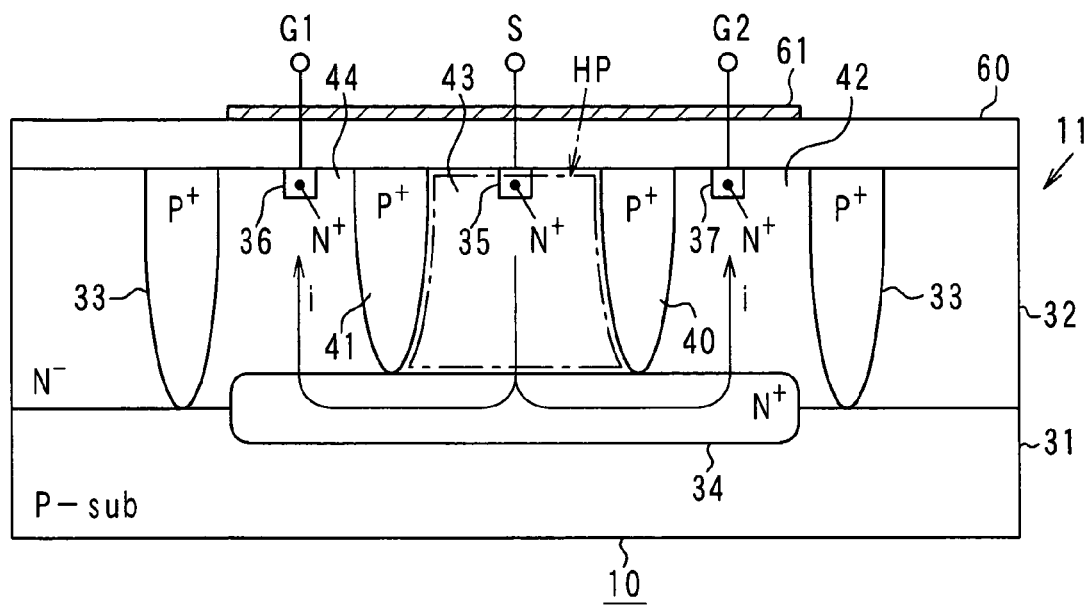
FIG. 8 is a diagram illustrating a cross-sectional view of a rotation sensor according to a modification of the first embodiment.

The vertical Hall element 11 can be formed as a diffusion layer in the semiconductor substrate 10, and the magnetoresistive elements 12, 13 can be formed as thin films on the semiconductor substrate 10. Therefore, for example, as shown in FIG. 8, a magnetoresistive element 61 can be formed (i.e., stacked) on the vertical Hall element 11. In such an approach, the rotation sensor can be much reduced in size. In FIG. 8, an insulating film 63 such as a silicon oxide film is placed between the silicon layer 32 and the magnetoresistive element 61 to electrically insulate the magnetoresistive element 61 from the silicon layer 32.

The number of rotations of the magnetic rotor 1 can be detected by counting the number of pulses outputted from the pulse circuit 51. In such an approach, the rotation of the magnetic rotor 1 can be detected over a range of angles above 360°.

Figure 9:
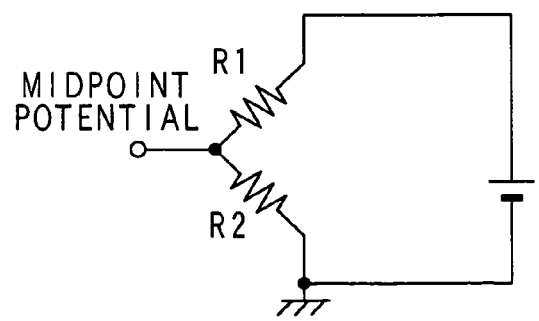
FIG. 9 is a diagram illustrating an electrical configuration replacing a magnetoresistive element.

Alternatively, the magnetoresistive elements 12, 13 can be configured as shown in FIG. 9. In FIG. 9, the magnetoresistive elements 12, 13 represented by resistors R1, R2 are connected in series, and a midpoint potential between the magnetoresistive elements 12, 13 is derived without reading the resistance values of the magnetoresistive elements 12, 13.

Second Embodiment

A second embodiment of the present invention is described below with reference to FIGS. 10-12. A difference between the first and second embodiments is as follows.

In the second embodiment, the rotation sensor is configured to detect rotation of a gear 70 as an object to be detected. A sensor chip 72 is located on the outside of the gear 70 in a radial direction of the gear 70. A permanent magnet 71 as a bias magnet is located on the outside of the sensor chip 72 in the radial direction of the gear 70. That is, the sensor chip 72 is located between the gear 70 and the bias magnet 71. A vertical Hall element 75 is located in the center of the sensor chip 72 in a left-right direction in FIG. 10.

The vertical Hall element 75 is located between magnetoresistive elements 73 and 74 in the left-right direction so that output of the vertical Hall element 75 can have a phase difference with respect to outputs of the magnetoresistive elements 73 and 74. The vertical Hall element 75 can have the same structure as the vertical Hall element 11 shown in FIGS. 3 and 4. In this way, the magnetoresistive elements 73 and 74 and the vertical Hall element 75 are located on the common sensor chip 72. In this way, the vertical Hall element 75 is formed in a semiconductor substrate (i.e., sensor chip 72) to detect a magnetic field parallel to a surface of the semiconductor substrate, and the magnetoresistive elements 73 and 74 are formed on the semiconductor substrate so that resistance values of the magnetoresistive elements 73 and 74 can change with strength of the magnetic field parallel to the surface of the semiconductor substrate.

Figure 11:
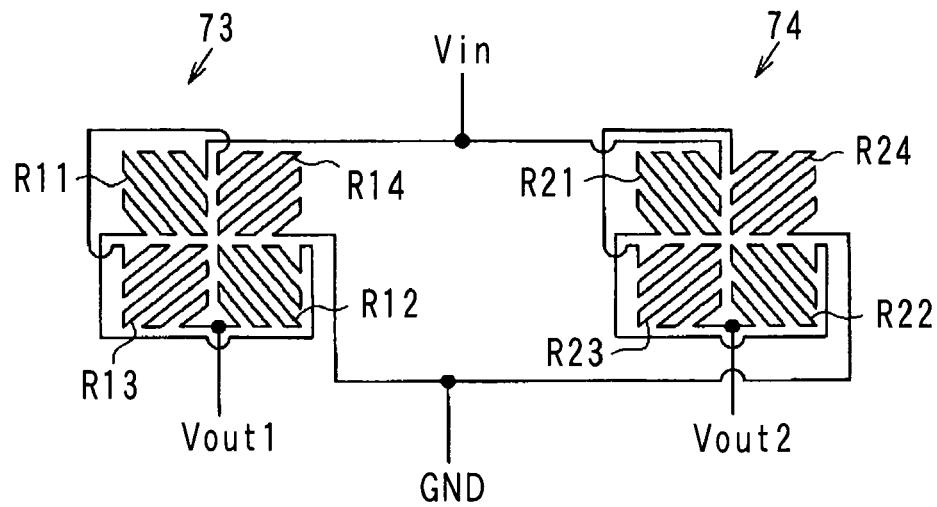
FIG. 11 is a diagram illustrating a circuit configuration of a magnetoresistive element of the second embodiment.

The magnetoresistive elements 73 and 74 are illustrated in detail in FIG. 11. As shown in FIG. 11, each of the magnetoresistive elements 73, 74 is configured as a full-bridge circuit. Specifically, the magnetoresistive element 73 includes four resistors R1, R12, R13, and R14 connected in series between a power supply voltage Vin and a ground GND. A potential at a junction between the resistors R12 and R13 is derived as an output signal Vout1. Likewise, the magnetoresistive element 74 includes four resistors R21, R22, R23, and R24 connected in series between the power supply voltage Vin and the ground GND. A potential at a junction between the resistors R22 and R23 is derived as an output signal Vout2.

Figure 12:
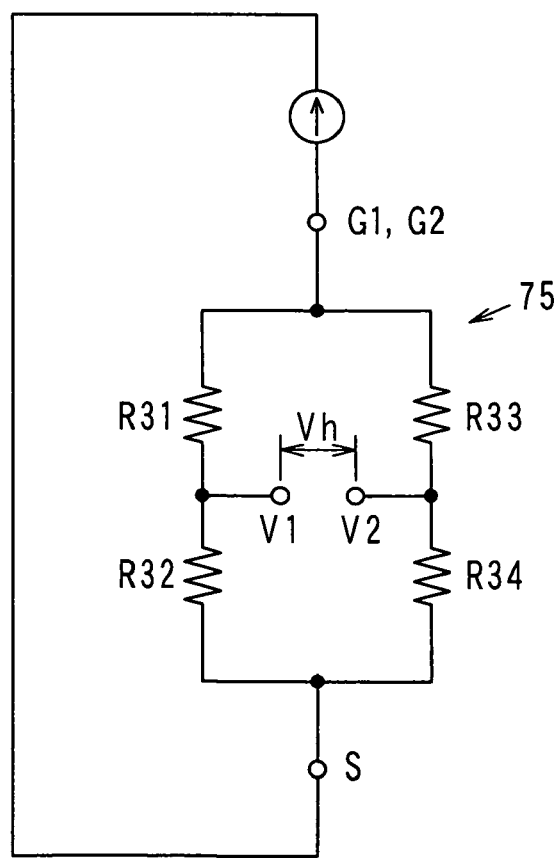
FIG. 12 is a diagram illustrating a equivalent circuit of a vertical Hall element.

FIG. 12 is a diagram illustrating an equivalent circuit of the vertical Hall element 75. As shown in FIG. 12, the vertical Hall element 75 can be approximated as a resistor bridge circuit. In the resistor bridge circuit, two resistors R31 and R32 are connected in series, and two resistors R33 and R34 are connected in series. A difference between a potential V1 at a junction between the resistors R31 and R32 and a potential V2 at a junction between the resistors R33 and R34 is derived as a Hall voltage Vh.

A rotation angle (i.e., rotation position) of the gear 70 can be detected based on output signals of the magnetoresistive elements 73 and 74. A rotation direction (i.e., forward or reverse) of the gear 70 can be detected based on an output signal of the vertical Hall element 75 and one of the output signals of the magnetoresistive elements 73 and 74. In this way, the rotation direction of the gear 70 is detected by using the phase difference between the outputs signals of the vertical Hall element 75 and the magnetoresistive elements 73 and 74.

Specifically, the output signal of the vertical Hall element 75 is digitized (i.e., binarized), and the digitized output signal of the vertical Hall element 75 is defined as a A-phase signal. Likewise, the output signal of the magnetoresistive element 73 (or the magnetoresistive element 74) is digitized, and the digitized output signal of the magnetoresistive element 73 is defined as a B-phase signal. In this case, a level of the B-phase signal is measured at a rising edge of the A-phase signal. If the level of the B-phase signal at the rising edge of the A-phase signal is at a high level, it is determined that the gear 70 rotates in a forward direction. Conversely, if the level of the second phase signal at the rising edge of the A-phase signal is at a low level, it is determined that the gear 70 rotates in a reverse direction. In this way, the rotation direction of the gear 70 can be detected based on the output signal of the vertical Hall element 75 and one of the output signals of the magnetoresistive elements 73 and 74.

As described above, according to the second embodiment, the vertical Hall element 75 is used to detect the rotation direction of the gear 70. In such an approach, the sensor chip 72 can be reduced in size.

Figure 13:
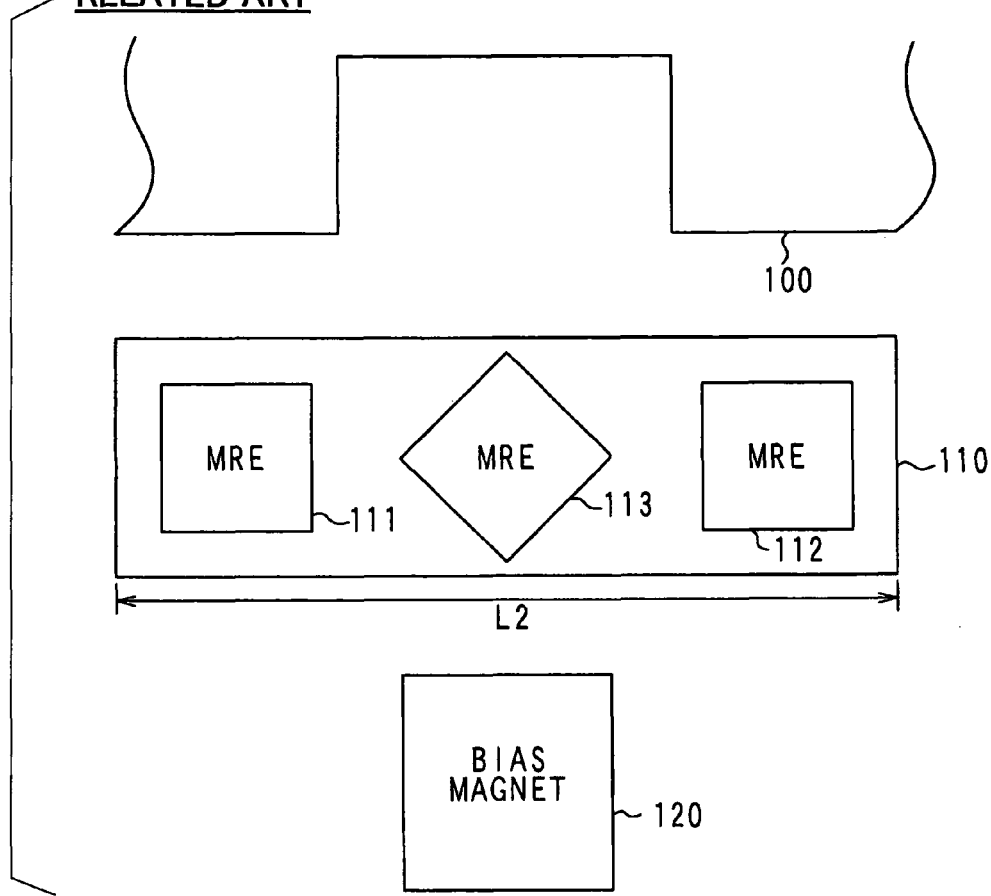
FIG. 13 is a diagram illustrating a plan view of a rotation sensor according to a second comparison example.
Figure 14:
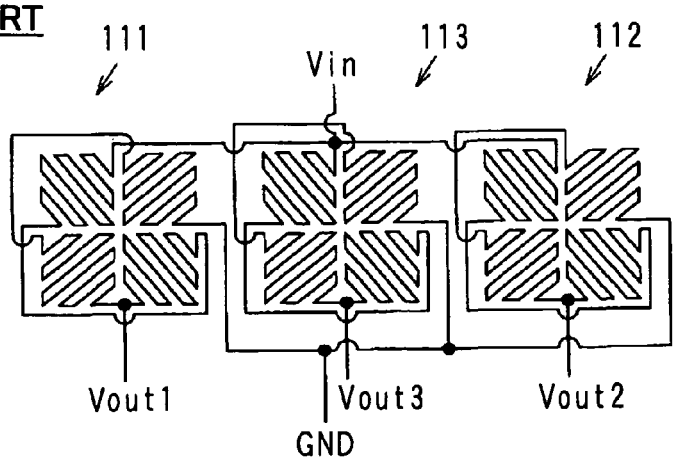
FIG. 14 is a diagram illustrating a circuit configuration of a magnetoresistive element of the second comparison example.

FIGS. 13 and 14 are diagrams illustrating an example of a rotation sensor compared to the rotation sensor of the second embodiment. In the comparison example shown in FIG. 13, a sensor chip 110 is located on the outside of a gear 100 in a radial direction of the gear 100. A permanent magnet 120 as a bias magnet is located on the outside of the sensor chip 110 in the radial direction of the gear 100. That is, the gear 100, the sensor chip 110, and the bias magnet 120 of the comparison example are arranged in the same manner as the gear 70, the sensor chip 72, and the bias magnet 71 of the second embodiment. A difference between the comparison example and the second embodiment is in that three magnetoresistive elements 111, 112, and 113 are arranged in a left-right direction in FIG. 13 so that output of the centered magnetoresistive element 113 can have a phase difference with respect to outputs of the magnetoresistive elements 111 and 112.

The magnetoresistive elements 111, 112, and 113 are illustrated in detail in FIG. 14. As shown in FIG. 14, each of the magnetoresistive elements 111, 112, and 113 is configured as a bridge circuit. In the comparison example, a rotation angle (i.e., rotation position) of the gear 100 is detected based on the output signals of the magnetoresistive elements 111 and 112. A rotation direction (i.e., forward or reverse) of the gear 100 is detected based on the output signal of the centered magnetoresistive element 113. In this way, the rotation direction of the gear 100 is detected by using the phase difference between the outputs signal of the centered magnetoresistive element 113 and the output signals of the magnetoresistive elements 111 and 112. However, since the magnetoresistive element 113 is larger in size than the vertical Hall element 75, a size L2 of the sensor chip 110 of the comparison example becomes larger than a size L1 of the sensor chip L1 of the sensor chip 72 of the second embodiment.

Figure 10:
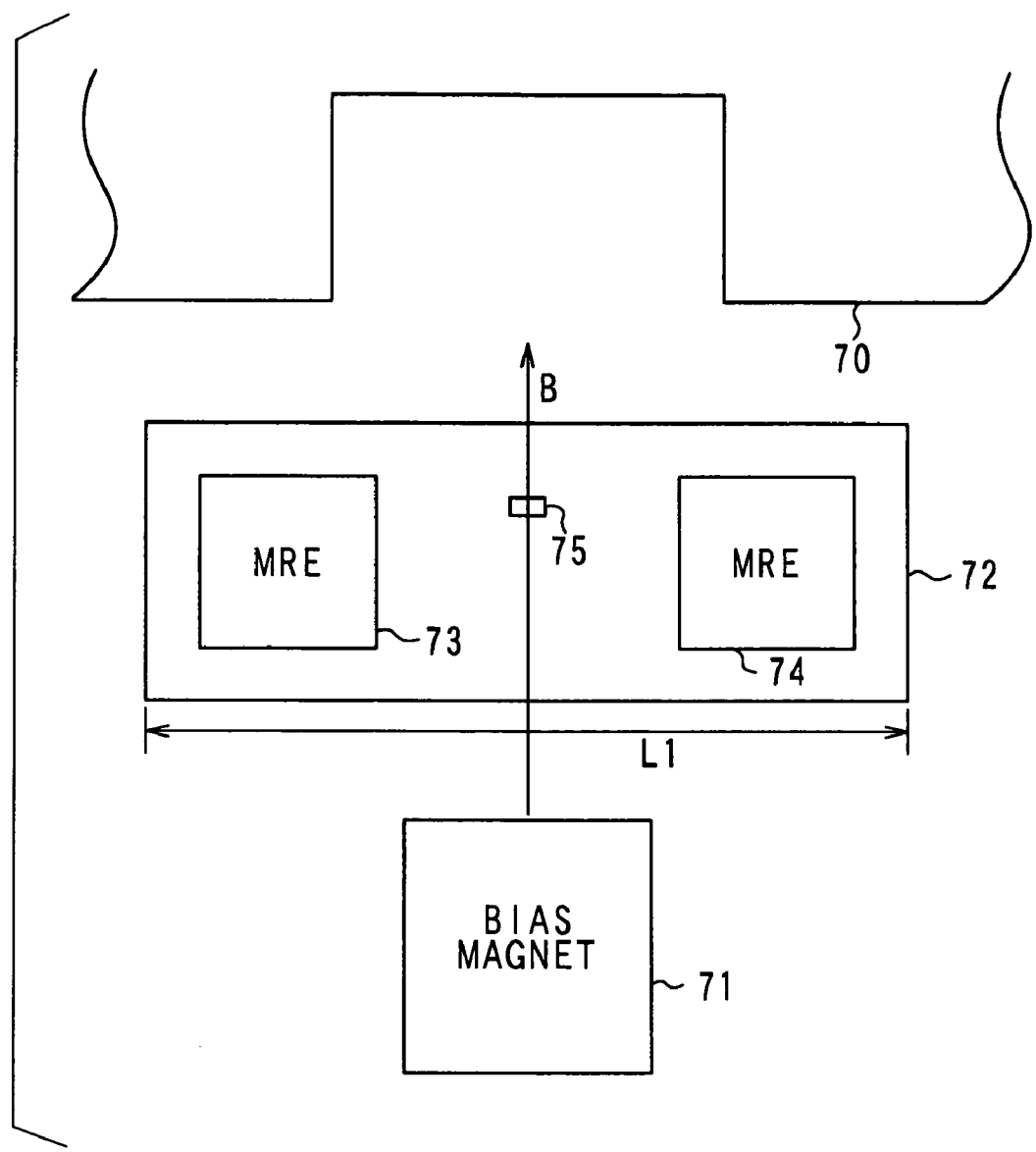
FIG. 10 is a diagram illustrating a plan view of a rotation sensor according to a second embodiment of the present invention.

That is, according to the second embodiment shown in FIG. 10, the rotation direction of the gear 70 is detected by using the vertical Hall element 75. In such an approach, the sensor chip 72 of the second embodiment can has a small size compared to the sensor chip 110 of the comparison example in which the rotation direction of the gear 100 is detected by using the magnetoresistive element 113.

(Modifications)

Figure 15A:
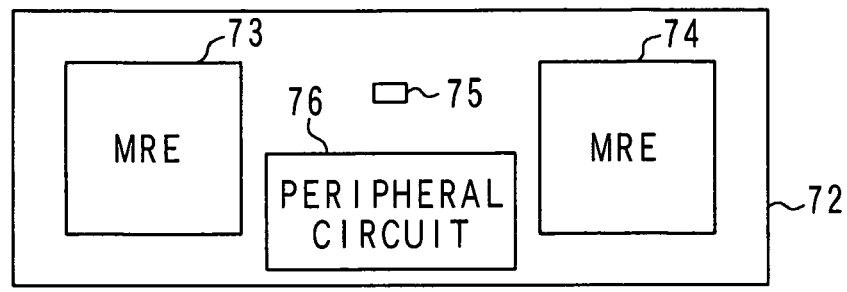
FIG. 15A is a diagram illustrating a plan view of a sensor chip according to a first modification of the second embodiment.
Figure 15B:
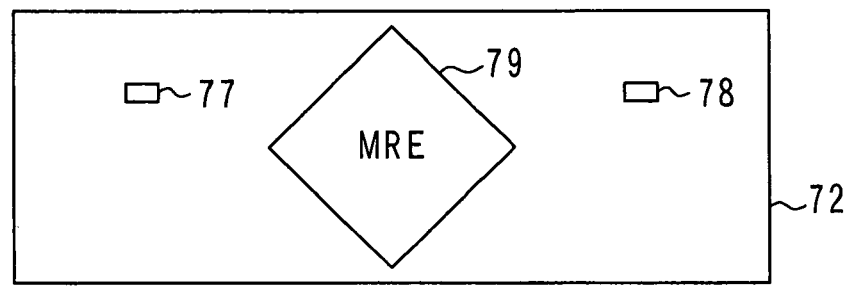
FIG. 15B is a diagram illustrating a plan view of a sensor chip according to a second modification of the second embodiment.

The embodiments described above can be modified in various ways. For example, the sensor chip 72 shown in FIG. 10 can be modified as shown in FIG. 15A. In FIG. 15A, a peripheral circuit 76 such as an amplifier is integrated into the sensor chip 72 so that the entire cost of the rotation sensor can be reduced. Further, the sensor chip 72 shown in FIG. 10 can be modified as shown in FIG. 15B. In FIG. 15B, the magnetoresistive elements 73 and 74 for detecting the rotation angle are replaced with vertical Hall elements 77 and 78, and the vertical Hall element 75 for detecting the rotation direction is replaced with a magnetoresistive element 79. In such an approach, the chip size can be much reduced.

Figure 15C:
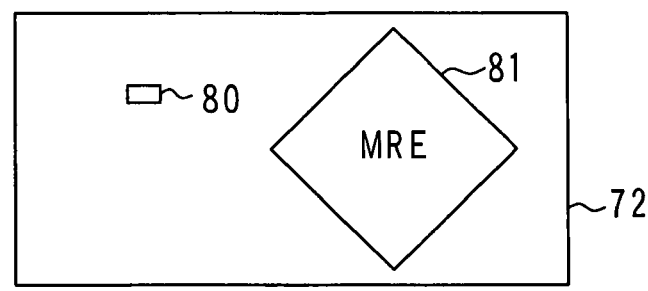
FIG. 15C is a diagram illustrating a plan view of a sensor chip according to a third modification of the second embodiment.

As described previously with reference to FIG. 12, since a vertical Hall element can be approximated as a resistor bridge circuit, a vertical Hall element can be used to detect a rotation angle. Therefore, as shown in FIG. 15C, the rotation sensor can be constructed with one vertical Hall element 80 and one magnetoresistive element 81. In such an approach, the magnetic field can be detected more accurately, and also the chip size can be much reduced.

The magnetoresistive element can be made of a material other than a thin film of NiFe. For example, the magnetoresistive element can be made of a thin film of NiCo.

Figure 16A:
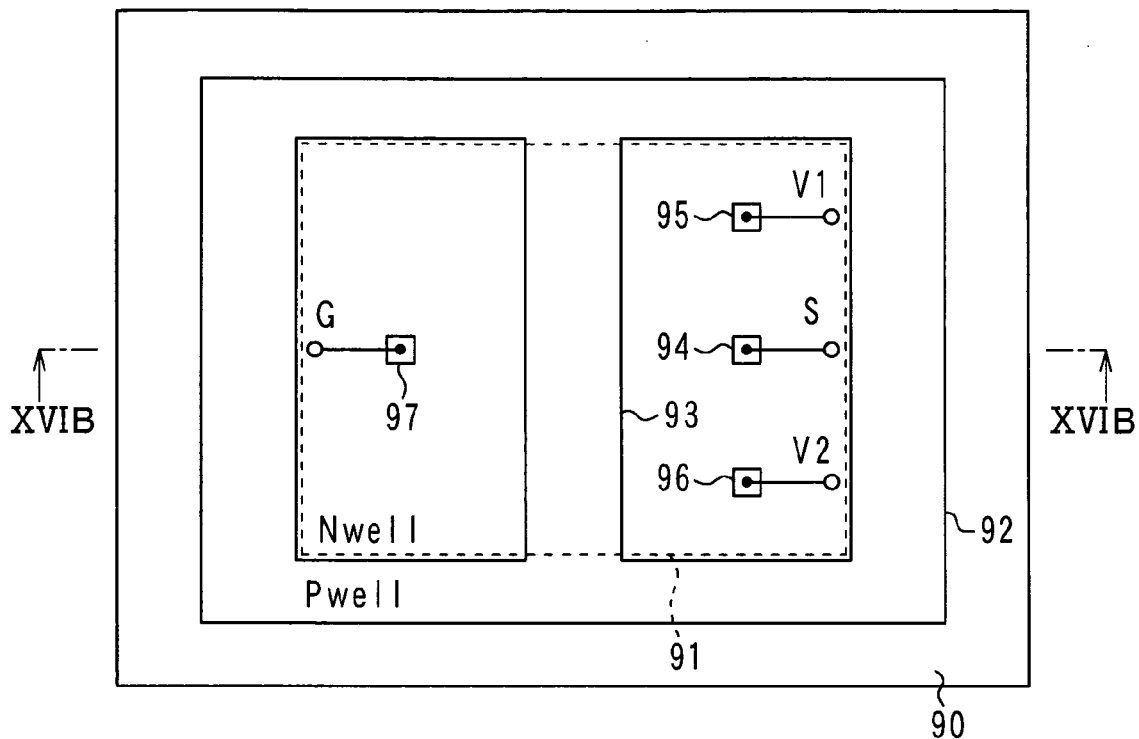
FIG. 16A is a diagram illustrating a plan view of a vertical Hall element according to a modification of the present invention.
Figure 16B:
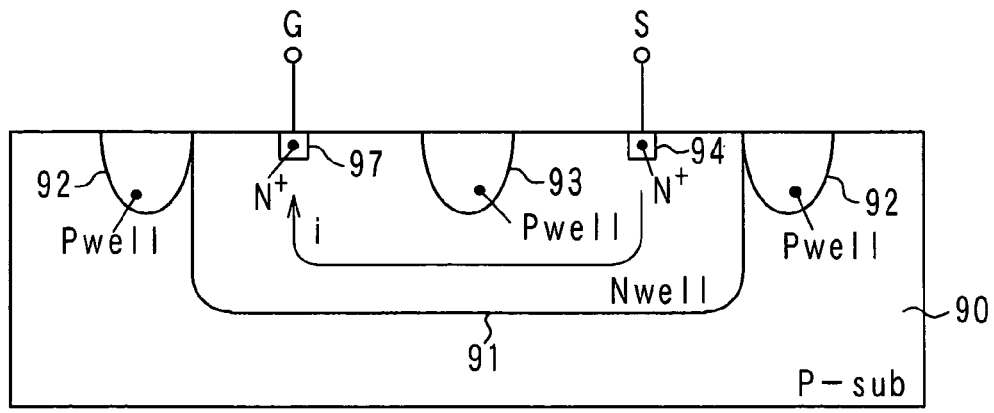
FIG. 16B is a diagram illustrating a cross-sectional view taken along the line XVIB-XVIB in FIG. 16A.

For example, the vertical Hall element shown in FIGS. 3 and 4 can be modified as shown in FIGS. 16A and 16B.

In FIGS. 16A and 16B, an N-well region 91 is formed in a P-type silicon substrate 90, and a P-well region 92 is formed in the shape of a rectangular ring to surround the N-well region 91. The N-well region 91 is divided into two sections by a P-well region 93. The depth of each of the P-well regions 92, 93 is smaller than the depth of the N-well region 91, when measured from the surface of the silicon substrate 90. N$^+$-type regions 94, 95 and 96 are arranged in a line at a surface portion of a first section of the N-well region 91. An N$^+$-type region 97 is formed to a surface portion of a second section of the N-well region 91. The depth of each of the N$^+$-type regions 94-97 is smaller than the depth of each of the P-well regions 92 and 93, when measured from the surface of the P-type silicon substrate 90. The N$^+$-type regions 94 and 97 serve as contact regions to form a current input portion. The N$^+$-type regions 95 and 96 serve as contact regions to form a voltage output portion.

Figure 17A:
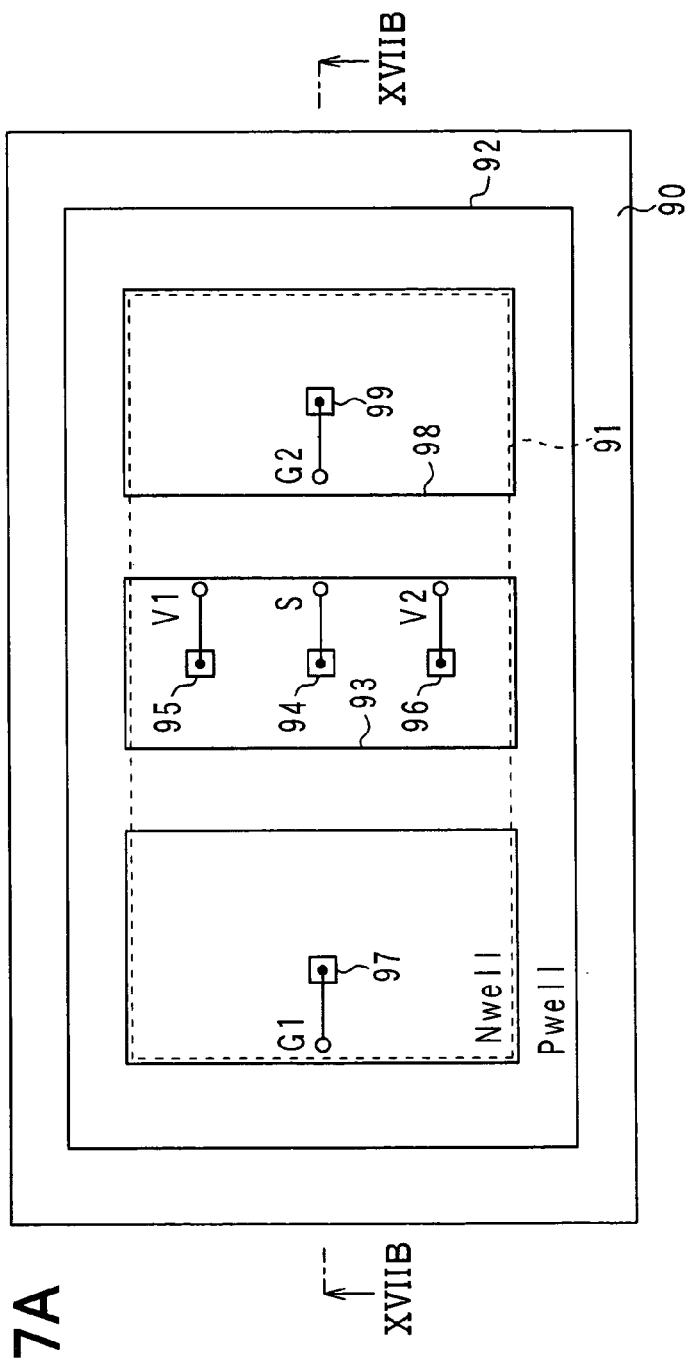
FIG. 17A is a diagram illustrating a plan view of a vertical Hall element according to another modification of the present invention.
Figure 17B:
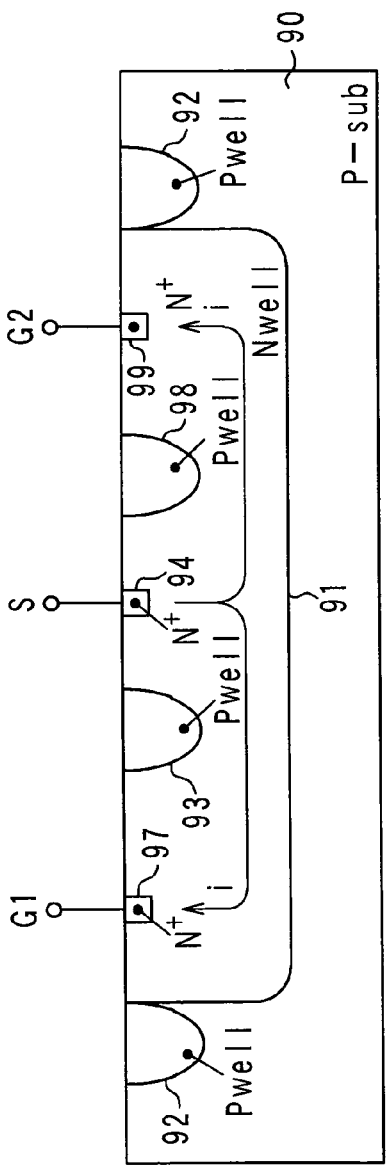
FIG. 17B is a diagram illustrating a cross-sectional view taken along the line XVIIB-XVIIB in FIG. 17A.

For example, the vertical Hall element shown in FIGS. 16A and 16B can be modified as shown in FIGS. 17A and 17B. In FIGS. 17A and 17B, the N-well region 91 is divided into three sections by a P-well region 98 in addition to the P-well region 93. An N$^+$-type region 99 is formed to a surface portion of a third section of the N-well region 91. The N$^+$-type region 99 serves as a contact region to form the voltage output portion.

The vertical Hall element shown in FIGS. 16A, 16B, 17A, and 17B can be manufactured by a standard CMOS process, not bipolar process. Therefore, manufacturing cost can be reduced.

In summary, according to the modification, the vertical Hall element includes the N-well region 91 (as a first well region of a second conductivity type) formed in the silicon substrate 90 (as a semiconductor substrate of a first conductivity type), the P-well region 93 (98) (as a second well region of the first conductivity type) formed in the silicon substrate 90 to divide the N-well region 91 into multiple sections, the N$^+$-type regions 94 and 97 (99) (first impurity diffusion regions of the second conductivity type) are formed to the surface portion of the N-well region 91 across the P-well region 93 (98) to form the current input portion, and the N$^+$-type regions 95 and 96 (as second impurity diffusion regions of the second conductivity type) are formed to the surface portion of the N-well region 91 to form the voltage output portion. The depth of the N-well region 91 is smaller than the depth of the P-well region 93 (98), when measured from the surface of the silicon substrate 90.

Such changes and modifications are to be understood as being within the scope of the present invention as defined by the appended claims.

What is claimed is:

1. A rotation sensor for detecting rotation of an object, the rotation sensor comprising:
    a semiconductor substrate;
    a vertical Hall element formed in the semiconductor substrate to detect a magnetic field parallel to a surface of the semiconductor substrate, the vertical Hall element outputting a detection signal corresponding to the detected magnetic field;
    a magnetoresistive element formed on the semiconductor substrate and having a resistance value changing with strength of the magnetic field, the magnetoresistive element outputting a resistance signal corresponding to the resistance value, wherein
    the rotation is detected based on the detection signal and the resistance signal,
    an arctan calculator;
    a pulse circuit configured to output a pulse signal by pulsing the detection signal; and
    a synthesizer, wherein
    the magnetoresistive element includes a first magnetoresistive element having a first resistance value changing with the rotation of the object and outputting a first resistance signal corresponding to the first resistance value, the magnetoresistive element further including a second magnetoresistive element having a second resistance value changing with the rotation of the object and outputting a second resistance signal corresponding to the second resistance value, the first and second resistance signals having a predetermined phase difference,
    the arctan calculator outputs an arctan signal by calculating the arctangent of the first and second resistance signals, and
    the synthesizer outputs a linear signal by synthesizing the arctan signal and the pulse signal, the linear signal representing the rotation of the object over a range of angles from 0° to 360°.

2. The rotation sensor according to claim 1, wherein the magnetoresistive element is a thin film of NiFe.

3. The rotation sensor according to claim 1, wherein the magnetoresistive element is a thin film of NiCo.

4. The rotation sensor according to claim 1, wherein the magnetoresistive element is located on the vertical Hall element.

5. The rotation sensor according to claim 1, wherein
the semiconductor substrate is of a first conductivity type,
the vertical Hall element includes a first well region of a second conductivity type, a second well region of the first conductivity type, a pair of first impurity diffusion regions of the second conductivity type, and a pair of second impurity diffusion regions of the second conductivity type,
a depth of the second well region is less than a depth of the first well region when measured from the surface of the semiconductor substrate,
the first well region is divided into a plurality of portions by the second well region,
the pair of first impurity diffusion regions are located at a surface portion of the second well region across the first well region to form a current input portion, and
the pair of second impurity diffusion regions are located at the surface portion of the second well region to form a voltage output portion.

6. A rotation sensor for detecting rotation of an object, the rotation sensor comprising:
a semiconductor substrate;
a vertical Hall element formed in the semiconductor substrate to detect a magnetic field parallel to a surface of the semiconductor substrate, the vertical Hall element outputting a detection signal corresponding to the detected magnetic field; and
a magnetoresistive element formed on the semiconductor substrate and having a resistance value changing with strength of the magnetic field, the magnetoresistive element outputting a resistance signal corresponding to the resistance value, wherein
the rotation is detected based on the detection signal and the resistance signal,
the semiconductor substrate is of a first conductivity type,
the vertical Hall element includes a first well region of a second conductivity type, a second well region of the first conductivity type, a pair of first impurity diffusion regions of the second conductivity type, and a pair of second impurity diffusion regions of the second conductivity type,
a depth of the second well region is less than a depth of the first well region when measured from the surface of the semiconductor substrate,
the first well region is divided into a plurality of portions by the second well region,
the pair of first impurity diffusion regions are located at a surface portion of the second well region across the first well region to form a current input portion, and
the pair of second impurity diffusion regions are located at the surface portion of the second well region to form a voltage output portion.

7. The rotation sensor according to claim 6, wherein the magnetoresistive element is a thin film of NiFe.

8. The rotation sensor according to claim 6, wherein the magnetoresistive element is a thin film of NiCo.

9. The rotation sensor according to claim 6, wherein the magnetoresistive element is located on the vertical Hall element.

* * * * *